(12) United States Patent
Dehlink et al.

(10) Patent No.: US 9,479,155 B2
(45) Date of Patent: Oct. 25, 2016

(54) EMITTER FOLLOWER BUFFER WITH REVERSE-BIAS PROTECTION

(71) Applicants: Bernhard Dehlink, Munich (DE); Cristian Pavao-Moreira, Frouzins (FR)

(72) Inventors: Bernhard Dehlink, Munich (DE); Cristian Pavao-Moreira, Frouzins (FR)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 14/899,130

(22) PCT Filed: Jul. 3, 2013

(86) PCT No.: PCT/IB2013/001764
§ 371 (c)(1),
(2) Date: Dec. 17, 2015

(87) PCT Pub. No.: WO2015/001371
PCT Pub. Date: Jan. 8, 2015

(65) Prior Publication Data
US 2016/0134273 A1    May 12, 2016

(51) Int. Cl.
*H03K 3/00* (2006.01)
*H03K 17/16* (2006.01)
*H03F 3/50* (2006.01)
*H03F 1/52* (2006.01)
*H03F 3/189* (2006.01)

(52) U.S. Cl.
CPC ............ *H03K 17/165* (2013.01); *H03F 1/52* (2013.01); *H03F 3/189* (2013.01); *H03F 3/50* (2013.01); *H03F 2200/294* (2013.01)

(58) Field of Classification Search
CPC .................................................. H03K 17/165
See application file for complete search history.

(56) References Cited

U.S. PATENT DOCUMENTS

| | | |
|---|---|---|
| 4,813,020 A | 3/1989 | Iwamura et al. |
| 5,079,447 A | 1/1992 | Lien et al. |
| 5,173,624 A | 12/1992 | Gabillard et al. |
| 5,304,868 A | 4/1994 | Yokoyama et al. |
| 5,479,005 A | 12/1995 | Okawa |
| 6,037,802 A * | 3/2000 | Watarai ............ H03K 19/00315 326/110 |
| 2011/0291749 A1 | 12/2011 | Lawas |
| 2012/0161850 A1 | 6/2012 | Rangarajan et al. |

OTHER PUBLICATIONS

International Search Report and Written Opinion correlating to PCT/IB2013/001764 issued on Apr. 9, 2014.

* cited by examiner

*Primary Examiner* — Daniel Puentes

(57) ABSTRACT

The invention relates to a buffer circuit for a receiver device including a transconductance stage and an output stage coupled in parallel to output stages of other channels of the device. The output of the transconductance stage is connected to a base of a bipolar transistor in the output stage. A switch is connected between the base of the bipolar transistor and the emitter of the bipolar transistor. A controller is arranged to switch the buffer circuit from a switch-off mode to a switch-on mode and back. In switch-off mode the switch is switched on, so as to connect the base and the emitter of the bipolar transistor.

11 Claims, 6 Drawing Sheets

EMITTER FOLLOWER BUFFER WITH REVERSE-BIAS PROTECTION

FIELD OF THE INVENTION

This invention relates to a buffer circuit. It also relates to a receiver device comprising such a buffer circuit.

BACKGROUND OF THE INVENTION

A buffer circuit (sometimes simply called a buffer) is one that provides electrical impedance transformation from one circuit to another. Buffer circuits are frequently used for intermediate frequency (IF) buffers in receiver devices having parallel channels. Buffers are often used as output stages (i.e. output buffers) on the receiver channels. Depending on application requirements, and considering that parallel channels are used in such receiver devices, one channel may be selected to be active, while the other is powered down. In these output buffers normally bipolar transistors are used because of their superior performance in terms of large output voltage swings, low supply currents, good linearity, and good current drive capability (size) as compared MOS devices.

In those applications, each IF buffer may comprise an emitter follower having an emitter of a bipolar transistor as an output. To save costs and space, often AC-coupling capacitors are left out, and so the emitters of the different bipolar transistors are directly connected. As a result, the bipolar transistor of the unused output stage may leave its safe operation region when a switch-off is implemented pulling its base to ground. In that situation, the emitter voltage of the bipolar transistor of the switched-off buffer may even get to a level that a base-emitter-voltage of that bipolar transistor exceeds the reverse breakdown limit, which results in unwanted breakdowns. This will degrade the performance and will limit the life time of the circuit.

SUMMARY OF THE INVENTION

The present invention provides a buffer circuit as described in the accompanying claims. The invention further provides a receiver device comprising such a buffer circuit.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
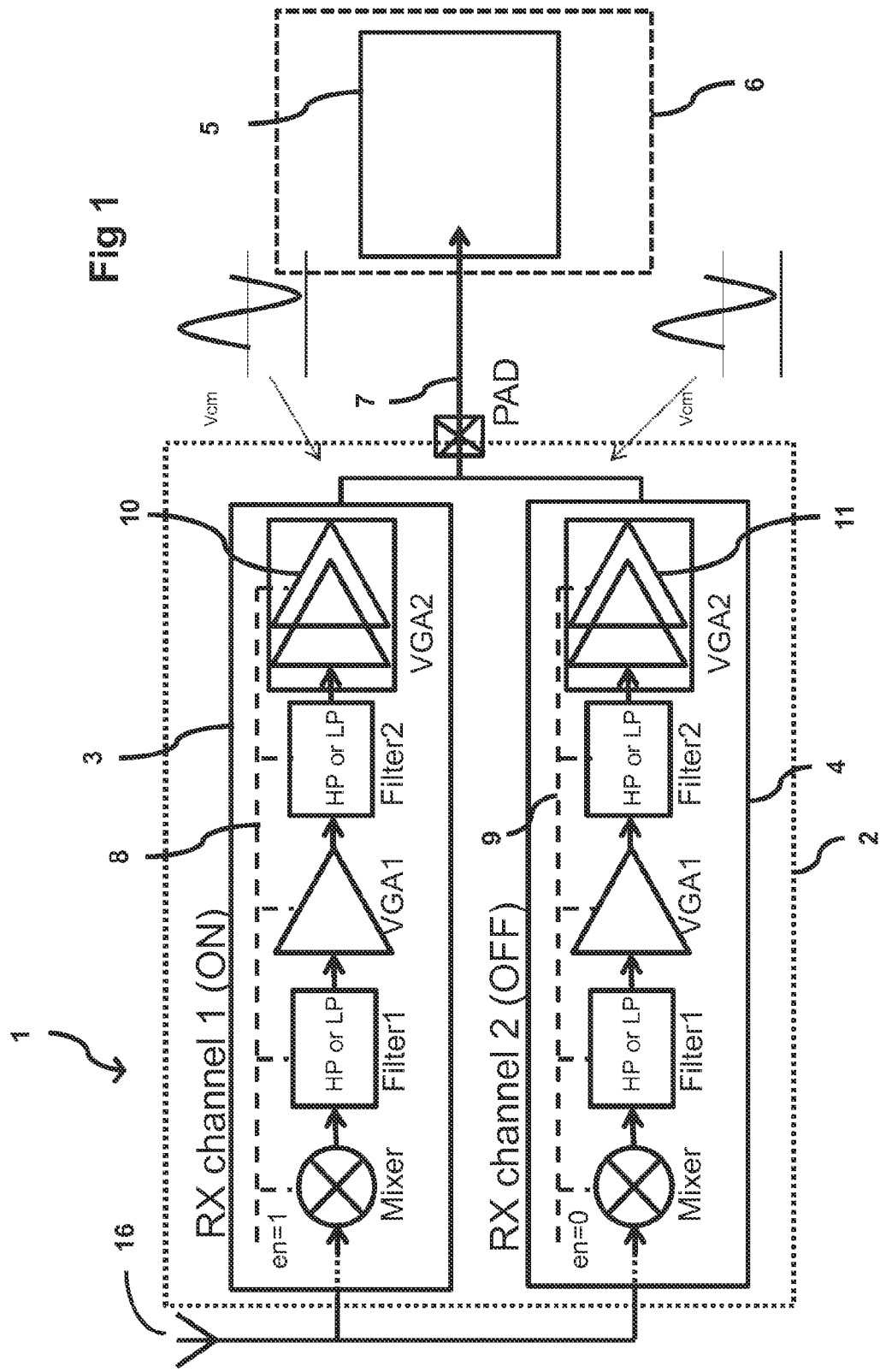
FIG. 1 schematically shows an example of an embodiment of a receiver device.

FIG. 1 shows a receiver device 1 according to an embodiment. The receiver device 1 comprises a receiver chip 2 with a plurality of channels 3, 4. Only two of the channels are shown in FIG. 1. An output of the chip 2 is connected to an IF external load 5 arranged on a printed circuit board 6. The channels 3,4 are arranged in parallel receiving input from an antenna 16 and outputting a signal 7 to the IF load 5.

The parallel channels 3, 4 are used in such a way that one channel 3 is selected to active, while the other(s) are powered down, see channel 4 in FIG. 1. In both channels 3, 4 an associated buffer stage 10, 11 is used as output stage sharing the same output 7. A control signal, see the dashed lines 8, 9 in FIG. 1, is used to control the channels 3, 4 to be selected (i.e. switched ON or OFF). This control signal may come from an external control (e.g. SPI access) or can be generated internally inside the receiver chip 2.

Figure 2:
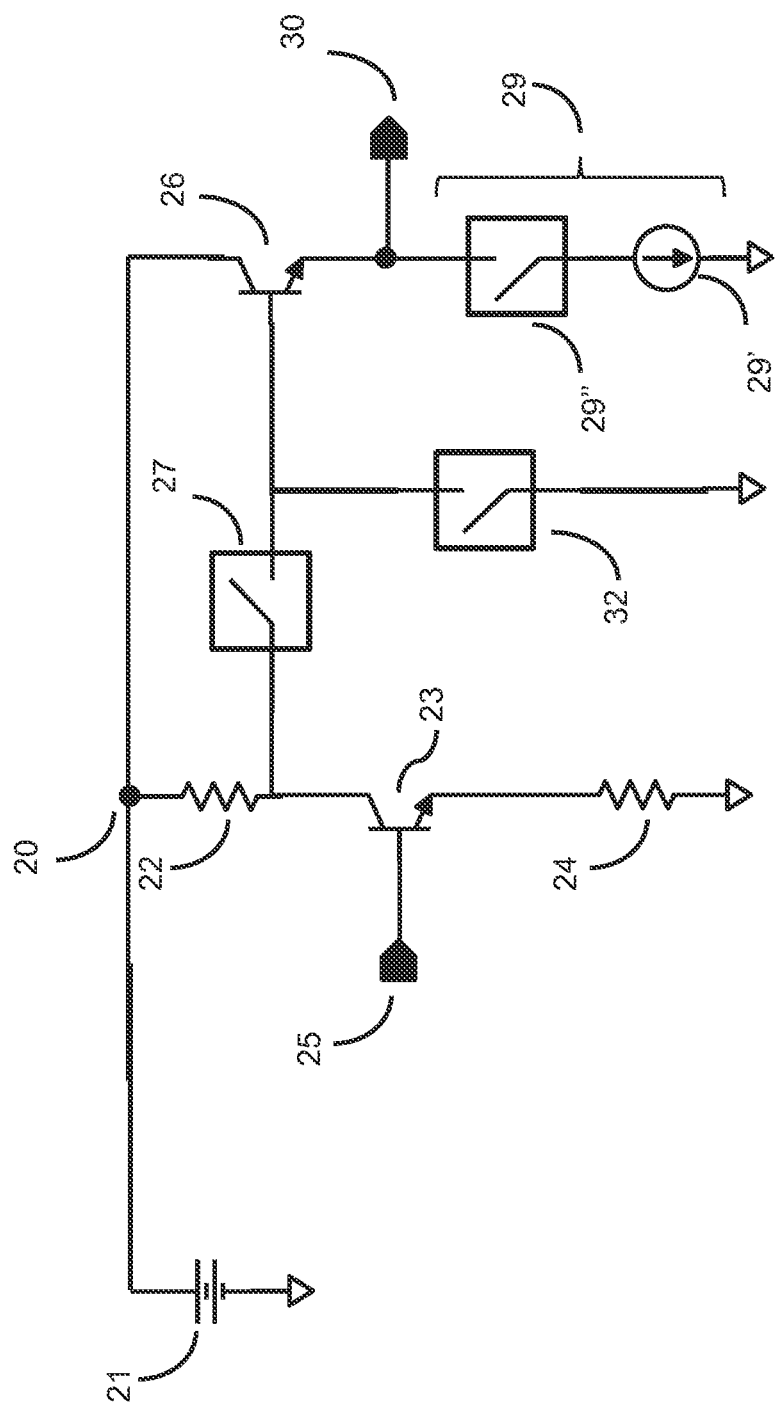
FIG. 2 schematically shows a buffer circuit according to the state of the art.

FIG. 2 shows a buffer circuit according to the state of the art. The buffer circuit of FIG. 2 comprises a supply node 20 connected to a power supply 21, and a first bipolar transistor 23 with a base, an emitter, and a collector. A resistive load 22 is connected between the collector of a first bipolar transistor 23 and the supply node 20. The emitter of the first bipolar transistor 23 is connected to ground via a resistor 24. The base of the first bipolar transistor 23 is connected to an input terminal 25. The buffer further comprises a second bipolar transistor 26. The collector of the second bipolar transistor 26 is connected to the supply node 20. The base of the second bipolar transistor 26 is connected to the collector of the first bipolar transistor 23 via a series switch 27. A switchable current source 29 is connected between the emitter of the second bipolar transistor 26 and ground. The switchable current source 29 is depicted as a current source 29' in series with an on/off switch 29". A shunt switch 32 is connected between the base of the second bipolar transistor 26 and ground. The buffer circuit is controlled by a controller (not shown in FIG. 2) which is arranged to control the switchable current sources 29 and the series switch 27 and shunt switches 32. The buffer circuit is switched from a switch-off mode to a switch-on mode and back.

In the switch-on mode the switchable current source 29 is switched on so as to enable activation of the emitter follower. Also the series switch 27 is switched on to connect the collector of the first transistor to the base of the second transistor 26. In the switch-on mode, the buffer will be forwarding an incoming AC signal at the input terminal 25 to the output terminal 30. In the switch-off mode, the switchable current source 29 is switched off, and also the series switch 27 is switched off. Furthermore, the shunt switch 32 will be switched on so as to pull the base of the second bipolar transistor 26 to ground, shutting off the emitter follower.

If multiple emitter followers (i.e. buffers) are connected in parallel without AC-coupling capacitors, the base of the second bipolar transistor 26 is biased at 0V and the emitter voltage at the second transistor will be between 0V and VCC-VBE of the other active emitter follower. As a result of this, the reverse breakdown limit at the second bipolar transistor can easily be exceeded. Subsequent BE breakdowns will degrade the performance and will limit the life time of the circuit.

Figure 3:
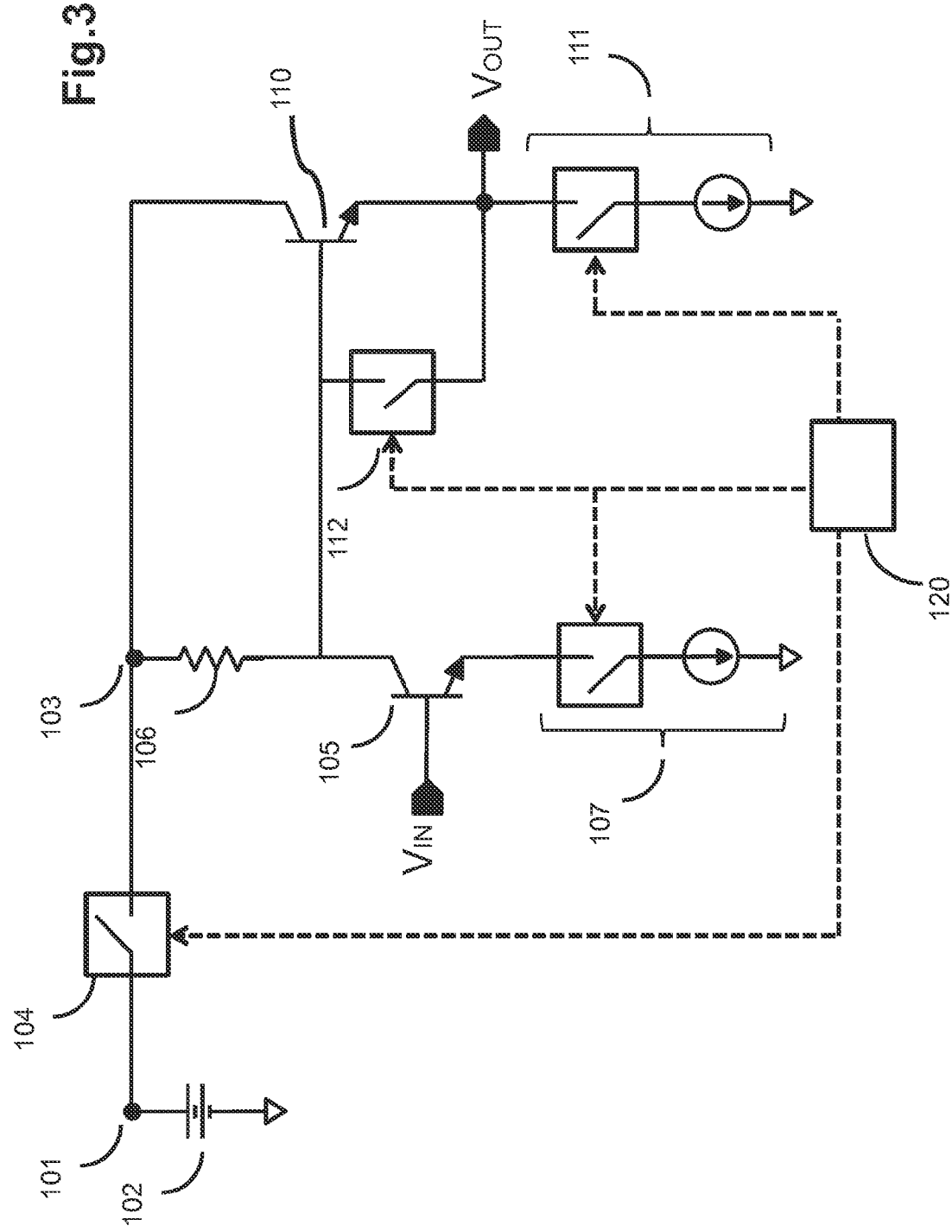
FIG. 3 shows an exemplary embodiment of a buffer circuit.

An exemplary embodiment of the invention is shown in FIG. 3. FIG. 3 shows a buffer circuit comprising a first supply node 101 for connection to a power supply 102 and a second supply node 103. The circuit further comprises a first switch 104 connected between the first supply node 101 and the second supply node 103 and a transconductance stage (gm) implemented by a first bipolar transistor 105 comprising a base, an emitter, and a collector. The first bipolar transistor 105 may be a NPN bipolar transistor. Alternatively, the transconductance stage (gm) can be made using e.g. an NMOS transistor having a gate source and drain (not shown).

As shown in FIG. 3 a resistive load 106 is connected between the collector of the first bipolar transistor 105 and the second supply node 103. A first switchable current source 107 is connected between the emitter of the first bipolar transistor 105 and ground. A second bipolar transistor 110 is used which comprises a base, an emitter, and a collector, with the collector of the second bipolar transistor 110 connected to the second supply node 103. The base of the second bipolar transistor 110 is connected to the collector of the first bipolar transistor 105. The circuit further comprises a second switchable current source 111 connected between the emitter of the second bipolar transistor 110 and ground. A second switch 112 is connected between the base of the second bipolar transistor 110 and the emitter of the second bipolar transistor 110. The circuit may also comprise a controller 120 arranged to control the first and second switchable current sources 107,111 and the first and second switches 104,112. To switch the buffer circuit from a switch-off mode to a switch-on mode and back, the controller 120 is arranged to send a control signal to the switches of the buffer circuit. The controller 120 may be activated via an independent control signal, see the signal lines 8, 9 in FIG. 1. It may be part of the buffer circuit and comprise some level shifters to adapt control logic level to local logic level, and at least one inverter (see 121, to generate Enable opposite logic level, i.e. Enabled or simply en). It may be situated inside the output buffer itself implemented as logic gates or simply logic.

In the switch-on mode the first 107 and second 111 switchable current sources are switched on, and the first switch 104 is switched on and the second switch 112 switched off. On the other hand in the switch-off mode, the first and second switchable current sources are switched off, and the first switch 104 is switched off and the second switch 112 switched on, so as to connect the base and the emitter of the second bipolar transistor 110.

Actually the circuit of FIG. 3 comprises an input stage followed by an output stage. The input stage comprises the resistive load 106, the first bipolar transistor 105 and the first switchable current source 107. The output stage comprises a so-called 'emitter follower' comprising the second bipolar transistor 110, the switchable current source 111 and the second switch 112.

In switch-off mode, the second switch 112 is switched-on, so that the base voltage of the second transistor 110 follows the emitter voltage. In this way a reverse breakdown (say Vbe<−250 mV, depending on the process used) is not possible, and no overstress will occur.

In the switch-on mode, the first and second switches 104, 112 do not impact the performance. No series switch is used all along the signal chain, so the gain accuracy and the output voltage swing are not affected by any series switch. Furthermore, isolation from the emitter follower to its previous stage (i.e. the input stage) is guaranteed through its correct power down, by means of switching off current source 107 and first switch 104, which guarantees a high impedance state, i.e., a high isolation.

Figure 4:
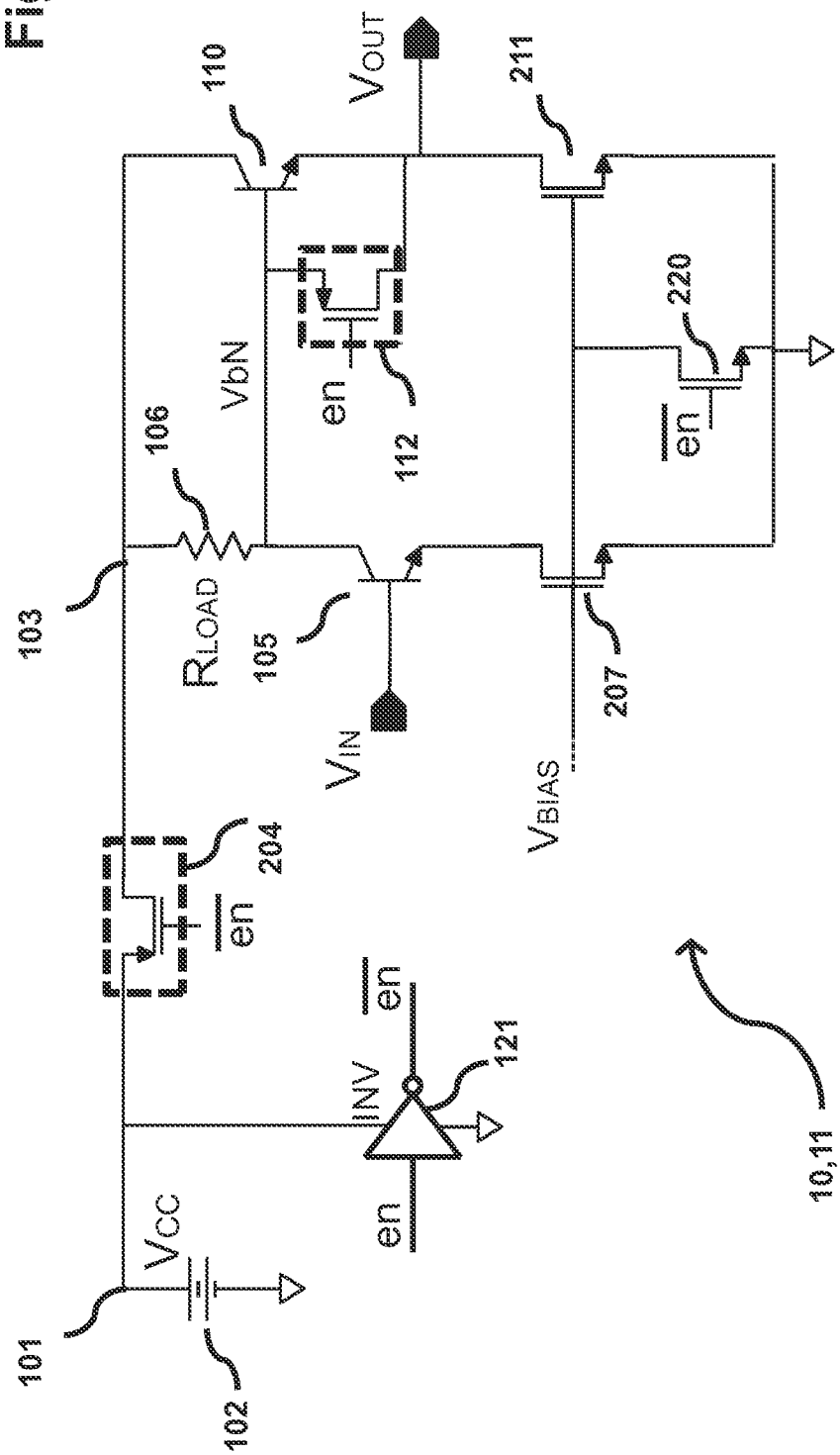
FIG. 4 shows an example of an implementation of the embodiment of FIG. 3.

FIG. 4 shows an example of an implementation of the embodiment of FIG. 3. In the example of FIG. 4, a MOS transistor 204 is arranged between the first supply node 101 and the second supply node 103. The gate of MOS transistor 204 is controlled by an enable/disable control signal depicted as enb or simply $\overline{en}$. The second switch 112 of FIG. 3 is implemented by a MOS transistor 212, the gate of which is controlled by an enable/disable control signal depicted as en. The two switchable current sources are embodied by MOS transistors 207, 211, the gate of which are controlled by a MOS transistor 220. The gate of the MOS transistor 220 is controlled by an enable/disable control signal depicted as enb. Please note that the inverted version of the signal en is enb. Typical values for the enable/disable signals en, enb are 3.3V and 0V.

To switch on the buffer circuit, the MOS transistor 220 is disabled so that the MOS transistors 211 and 207 are biased and conducting. At the same time, the MOS transistor 212 is disabled, and the MOS transistor 204 is enabled, so as to supply power to the input and output stages. MOS transistors 204 and 220 allow at same time a correct power down of the buffer circuit with extremely low OFF current consumption, and also a good reverse isolation (i.e. from the output stage to input stage).

Figure 5:
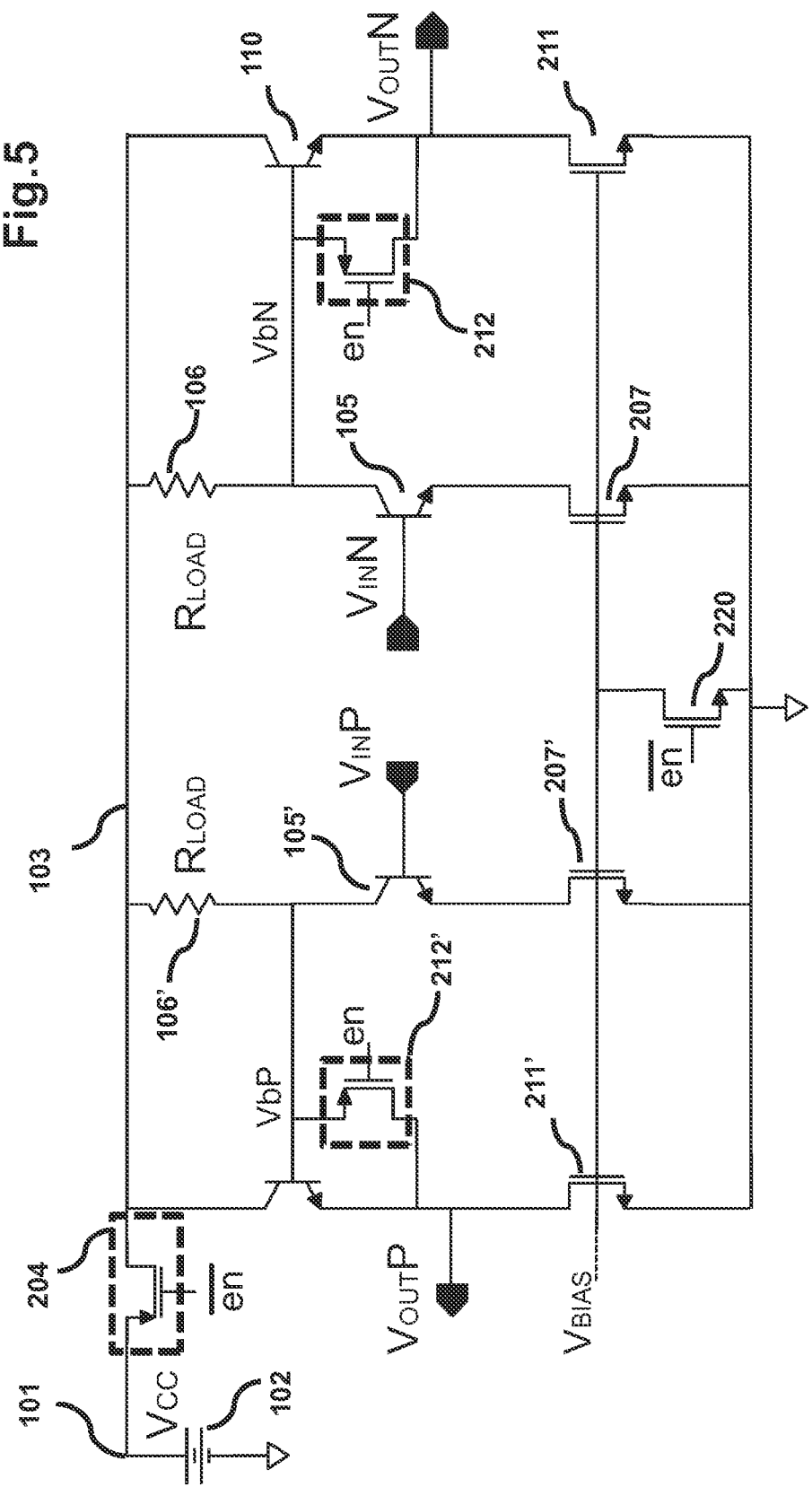
FIG. 5 shows an example of a further embodiment.

FIG. 5 shows an example of a further embodiment. In this embodiment, the circuit is a differential buffer circuit having two input terminals VinN, VinP and two output terminals VoutN, VoutP. Approximately half of the circuit of FIG. 5 resembles that of FIG. 4, and the other half is a mirrored copy. In FIG. 5 the components 105, 106, 110, 207, 211, 212 all have their counterpart in the P-part of the circuit, see components 105', 106', 110', 207', 211', 212'. As can be seen in FIG. 5, the circuit also comprises a MOS transistor 204 for connecting and disconnecting the supply node 103 from the supply node 101, and thus from the power supply 102.

All four current sources (i.e. the MOS transistors 207, 211, 207', 211') are controlled by the controller (not shown) via the central MOS transistor 220. As in FIG. 4, the gates of the four MOS transistors 207, 211, 207', 211' in FIG. 5 are biased using a voltage $V_{BIAS}$.

As in the example of FIG. 4, the MOS transistors 212, 212' of FIG. 5 will avoid a reverse breakdown in the switch-off mode of the buffer circuit. The MOS transistor 204 will provide a high isolation between the channel on/off.

Figure 7:
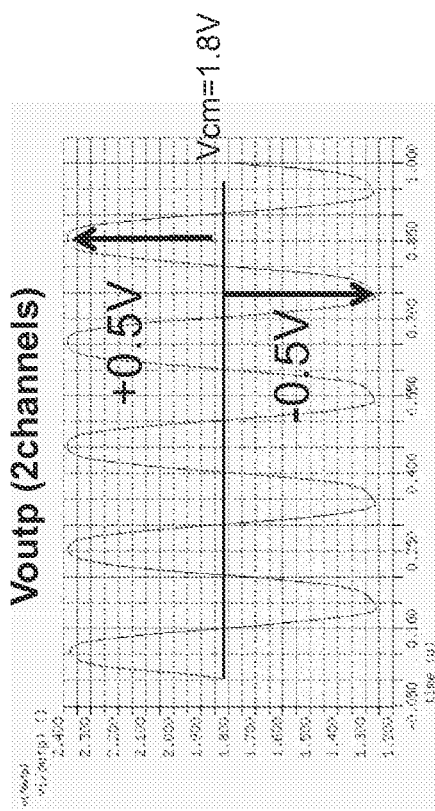
FIGS. 6 and 7 show results of a simulation of the buffer circuit according to an embodiment.
Figure 6:
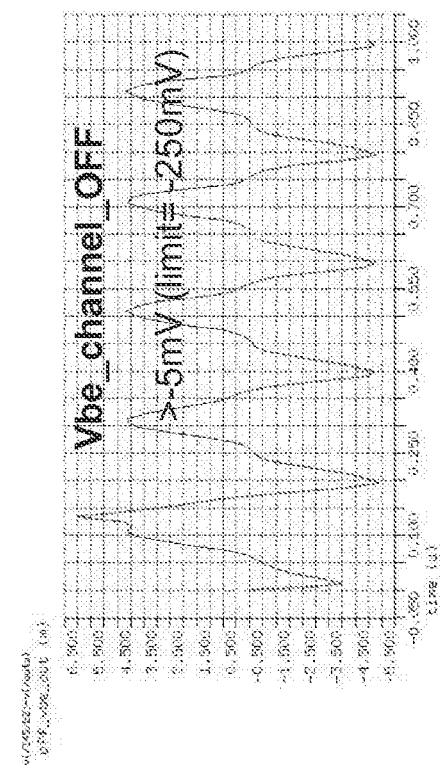

In FIGS. 6 and 7 some of the results of a simulation of the buffer circuit of FIG. 4 are shown. FIG. 6 is a graph of a base-emitter voltage of the channel output buffer 11 in OFF state, i.e., with the reverse biased protection activated, as a function of time t. FIG. 7 shows the corresponding output voltage Voutp as a function of time of the same simulation.

From the graph of FIG. 6 it can be seen that even with a very high swing (see FIG. 7: 1V peak-to-peak single-ended) at the common output 7 (due to the channel buffer 10 being in the ON state), the negative base-emitter voltage of the channel 2 OFF state buffer is between −5 mV and +6 mV and it never exceeds the maximum allowed breakdown voltage of e.g. −250 mV.

In the embodiments described above the base of the bipolar transistor 110 is directly connected (so no switch in between) to the output terminal of the transconductance stage 105. Due to the fact that the output buffers 10, 11 do not comprise any switch in the signal path, a very good linearity is obtained as can be seen from the simulation results of FIG. 7.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Each digital signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A buffer circuit, said buffer circuit comprising:
   a first supply node configured to connect to a power supply;
   a second supply node;
   a first switch connected between said first supply node and said second supply node;
   a transconductance stage comprising an input terminal, an output terminal and a reference terminal,
   a resistive load connected between said output terminal of said transconductance stage and said second supply node;
   a first switchable current source connected between said reference terminal of said transconductance stage and ground;
   a bipolar transistor comprising a base, an emitter, and a collector, said collector of said bipolar transistor being connected to said second supply node, said base of said bipolar transistor connected to said output terminal of said transconductance stage;
   a second switchable current source connected between said emitter of said bipolar transistor and ground;
   a second switch connected between said base of said bipolar transistor and said emitter of said bipolar transistor,
   said buffer circuit being arranged to so as to be switched from a switch-off mode to a switch-on mode and back, whereby in said switch-on mode said first and second switchable current sources are switched on, and said first switch is switched on and said second switch switched off, and whereby in said switch-off mode said first and second switchable current sources are switched off, and said first switch is switched off and said second switch switched on, so as to connect said base and said emitter of said bipolar transistor.

2. A buffer circuit according to claim 1, said buffer circuit comprising:
   a controller arranged to control said first and second switchable current sources and said first and second switches, so as to switch said buffer circuit from said switch-off mode to said switch-on mode and back.

3. A buffer circuit according to claim 1, wherein said first switch comprises a MOS transistor.

4. A buffer circuit according to claim 1, wherein said second switch comprises a MOS transistor.

5. A buffer circuit according to claim 1, wherein said second switch comprises an N-channel depletion type MOSFET with its source connected to said base of said bipolar transistor.

6. A buffer circuit according to claim 1, wherein said first and second switchable current sources each comprise a MOS transistor the gate of which is controlled by a switchable further MOS transistor.

7. A buffer circuit according to claim 1, wherein said base of said bipolar transistor is directly connected to said output terminal of said transconductance stage.

8. A buffer circuit according to claim 1, wherein said transconductance gate comprises an NPN bipolar transistor with a base as the input terminal, an emitter as the reference terminal, and a collector as the output terminal.

9. A buffer circuit according to claim 1, wherein said transconductance gate comprises an NMOS transistor.

10. A buffer circuit according to claim 1, said buffer circuit further comprising:
   a further transconductance stage comprising an input terminal, an output terminal and a reference terminal,
   a further resistive load connected between said output terminal of said further transconductance stage and said second supply node;
   a third switchable current source connected between said emitter of said third bipolar transistor and ground;
   a further bipolar transistor comprising a base, an emitter, and a collector, said collector of said further bipolar transistor connected to said second supply node, said base of said further bipolar transistor connected to said output terminal of said further transconductance stage;
   a fourth switchable current source connected between said emitter of further bipolar transistor and ground;
   a fourth switch connected between said base of said further bipolar transistor and said emitter of said further bipolar transistor.

11. A receiver device comprising at least two channels, each of said channels comprising a buffer circuit according to claim 1, said buffer circuits being arranged so as to share the same output.

* * * * *